United States Patent
Schultz et al.

(10) Patent No.: US 11,256,520 B2
(45) Date of Patent: Feb. 22, 2022

(54) TRACING STATUS OF A PROGRAMMABLE DEVICE

(71) Applicant: Xilinx, Inc., San Jose, CA (US)

(72) Inventors: David P. Schultz, Longmont, CO (US); Adrian M. Hernandez, Longmont, CO (US); David Robinson, Loanhead (GB); Elessar Taggart, Longmont, CO (US); Max Heimer, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 119 days.

(21) Appl. No.: 16/574,956

(22) Filed: Sep. 18, 2019

(65) Prior Publication Data

US 2021/0081215 A1    Mar. 18, 2021

(51) Int. Cl.
  G06F 11/00     (2006.01)
  G06F 9/445     (2018.01)
  G06F 11/07     (2006.01)

(52) U.S. Cl.
  CPC ...... *G06F 9/44505* (2013.01); *G06F 11/0751* (2013.01); *G06F 11/0778* (2013.01); *G06F 11/0787* (2013.01)

(58) Field of Classification Search
  CPC ............ G06F 9/44505; G06F 11/0751; G06F 11/0778; G06F 11/0787; G06F 11/3065; G06F 11/3636
  See application file for complete search history.

(56) References Cited

U.S. PATENT DOCUMENTS

| 6,701,284 | B1* | 3/2004 | Huntley | G05B 19/05 702/187 |
| 7,853,916 | B1* | 12/2010 | Trimberger | H03K 17/693 716/134 |
| 8,924,907 | B1* | 12/2014 | Jahnke | G06F 30/34 716/117 |
| 2004/0236998 | A1 | 11/2004 | Blumberg et al. | |
| 2014/0201852 | A1* | 7/2014 | Pedersen | G06F 21/86 726/34 |
| 2016/0098218 | A1* | 4/2016 | Kim | G06F 11/1441 711/162 |

FOREIGN PATENT DOCUMENTS

EP    3 153 980 A1    4/2017
JP    2007233761 A  *  9/2007

OTHER PUBLICATIONS

Machine translation of JP2007233761 (Year: 2007).*
Bilski et al., "Device With Data Processing Engine Array", U.S. Appl. No. 15/944,307, filed Apr. 3, 2018, 123 pages.

(Continued)

*Primary Examiner* — Philip Guyton
(74) *Attorney, Agent, or Firm* — Kevin T. Cuenot

(57) ABSTRACT

Tracing status of a programmable device can include, in response to loading a device image for the programmable device, determining, using a processing unit on the programmable device, trace data for the device image, storing, by the processing unit, the trace data for the device image in a memory, and, in response to unloading the device image, recording the unloading of the device image in the trace data in the memory.

18 Claims, 5 Drawing Sheets

(56) References Cited

OTHER PUBLICATIONS

Swarbrick et al., "Configurable Network-on-Chip for a Programmable Device", U.S. Appl. No. 16/041,473, filed Jul. 20, 2018, 34 pages.
Ahmad et al., "Adaptive Integrated Programmable Device Platform", U.S. Appl. No. 16/367,108, filed Mar. 27, 2019, 131 pages.
"Xilinx AI Engines and Their Applications," Xilinx, Inc., White Paper WP506 (v1.0.2), Oct. 3, 2018, 13 pages.
Versal: The First Adaptive Compute Acceleration Platform (ACAP), Xilinx, Inc. White Paper WP505 (v1.0), Oct. 2, 2018, 21 pages.
"Versal Architecture and Product Data Sheet: Overview," Xilinx, Inc., Datasheet DS950 (v1.0), Oct. 2, 2018, 23 pages.
Logix: "How To Show A History Of Installed, Upgraded Or Removed Packages In Debian, Ubuntu or Linux Mint [dpkg]—Linux Uprising Blog", Jan. 16, 2019 (Jan. 16, 2019), XP055744385, Retrieved from the Internet: URL:https://www.linuxuprising.com/2019/01/how-to-show-history-of-installed.html [retrieved on Oct. 27, 2020] p. 2-p. 4.

\* cited by examiner

TRACING STATUS OF A PROGRAMMABLE DEVICE

TECHNICAL FIELD

This disclosure relates to tracing the status of a programmable device such as a programmable integrated circuit (IC).

BACKGROUND

Integrated circuits (ICs) can be implemented to perform a variety of functions. Some ICs can be programmed to perform specified functions. One example of an IC that can be programmed is a field programmable gate array (FPGA). An FPGA includes programmable logic that is often implemented as an array of programmable tiles. These programmable tiles may include, for example, input/output blocks (IOBs), configurable logic blocks (CLBs), dedicated random access memory blocks (BRAM), multipliers, and digital signal processing blocks (DSPs).

Other varieties of programmable ICs may include additional resources that may be used in conjunction with the programmable logic. Examples of these additional resources may include, but are not limited to, hardwired circuits such as processors, memory controllers, and transceivers that, while hardwired unlike programmable logic, still may be programmed to operate in one of a plurality of different operating states or modes.

The extensive programmability of modern devices coupled with the fact that these devices may be continually reconfigured (e.g., completely reconfigured) and/or continually partially reconfigured over time, means that knowing the particular operating state of the device at any given point in time may not be feasible. This makes activities such as debugging, application development for the device, and device management difficult.

SUMMARY

In one aspect, a method can include, in response to loading a device image for a programmable device, determining, using a processing unit on the programmable device, trace data for the device image, storing, by the processing unit, the trace data for the device image in a memory, and, in response to unloading the device image, recording the unloading of the device image in the trace data in the memory.

In another aspect, a device can include a plurality of programmable circuit resources and a processor configured to program the programmable circuit resources. The processor can initiate executable operations including, in response to loading a device image for the device, determining trace data for the device image, wherein the device image includes programming data for one or more of the plurality of programmable circuit resources, storing the trace data for the device image in a memory, and, in response to unloading the device image, recording the unloading of the device image in the trace data in the memory.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
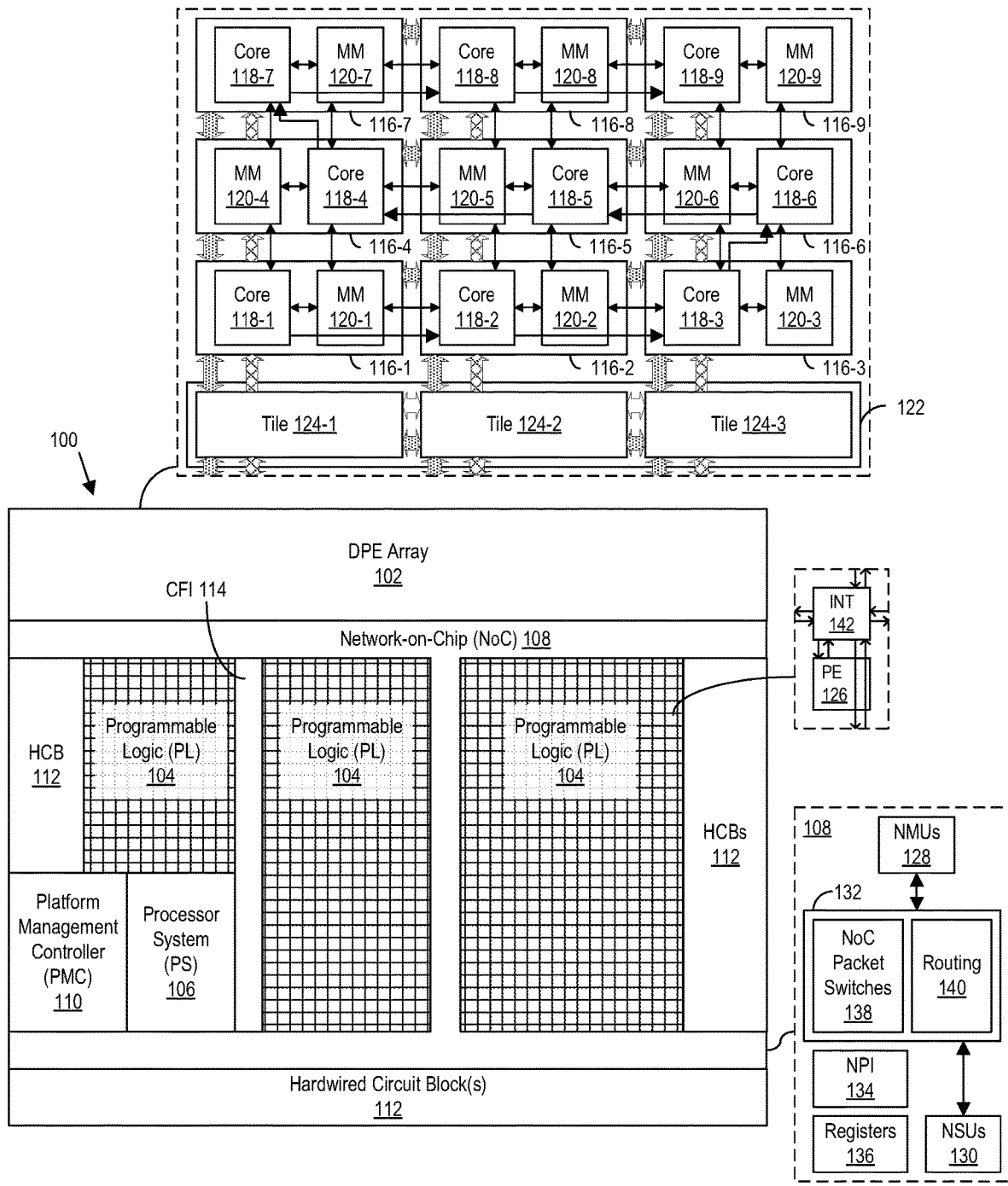
FIG. 1 illustrates an example architecture for a programmable device.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to tracing the status of a programmable device such as a programmable integrated circuit (IC). In accordance with the inventive arrangements described within this disclosure, the status of a programmable device, e.g., an IC, may be tracked over time. The programmable device includes a processor that is capable of tracking the status of the programmable device over time with regard to the loading and/or unloading of device images therein. For example, as different device images are loaded into the programmable device over time, information relating to each device image may be stored by the processor. As device images are unloaded from the programmable device, the processor may store further information relating to the unloading of each device image. In one aspect, the processor is capable of storing the information in real time as device images are loaded into the programmable device and/or unloaded from the programmable device.

By storing information relating to the loading and/or unloading of device images for the programmable device over time, a historical record the different compute units and/or user-specified circuits implemented in the programmable device is created. This historical record, which is created by the programmable device itself as opposed to an external system, may be read and used for purposes of debugging or other analysis. In one aspect, the processor in the programmable device that creates the historical record is the same processor responsible for loading and unloading the device images. As such, the historical record is a complete view of the different device images loaded into and unloaded from the programmable device over time.

In the case of conventional programmable devices, efforts to track the status of the device over time is often performed by an external system. For example, a host system may use the programmable device as an accelerator. As such, the host system may track any device images the host system itself provides to the programmable device over time. Modern programmable devices, however, often have multiple different and independent communication paths through which a device image may be loaded. Some of these communication paths are not observable by the host system. As such, the host system is unable to track each of these communication paths.

As an illustrative and non-limiting example, the programmable device may have a Peripheral Component Interconnect Express (PCIe) connection to the host system, a Joint Test Action Group (JTAG) port connected to another system, and/or an Ethernet connection to yet another external system. The host system may only be able to track device images the host system provides to the programmable device via the PCIe connection. The programmable device, however, may obtain a device image via JTAG or Ethernet without the host system being aware. In this example, any historical record created by the host system would be incomplete and inaccurate.

Given the number of times that a programmable device may be reconfigured and/or reprogrammed with a new device image and that modern devices may be loaded with multiple different device images concurrently, tracking the status of the device images over time becomes increasingly significant for purposes of debugging, performance analysis, and system development.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example architecture for a programmable device 100. Programmable device 100 is an example of a programmable IC and an adaptive system. In one aspect, programmable device 100 is also an example of a System-on-Chip (SoC). In the example of FIG. 1, programmable device 100 is implemented on a single die provided within a single integrated package. In other examples, programmable device 100 may be implemented using a plurality of interconnected dies where the various programmable circuit resources illustrated in FIG. 1 are implemented across the different interconnected dies.

In the example, programmable device 100 includes a data processing engine (DPE) array 102, programmable logic (PL) 104, a processor system (PS) 106, a Network-on-Chip (NoC) 108, a platform management controller (PMC) 110, and one or more hardwired circuit blocks 112. A configuration frame interface (CFI) 114 is also included.

DPE array 102 is implemented as a plurality of interconnected and programmable data processing engines (DPEs) 116. DPEs 116 may be arranged in an array and are hardwired. Each DPE 116 can include one or more cores 118 and a memory module (abbreviated "MM" in FIG. 1) 120. In one aspect, each core 118 is capable of executing program code stored in a core-specific program memory contained within each respective core (not shown). Each core 118 is capable of directly accessing the memory module 120 within the same DPE 116 and the memory module 120 of any other DPE 116 that is adjacent to the core 118 of the DPE 116 in the up, down, left, and right directions. For example, core 118-5 is capable of directly reading memory modules 120-5, 120-8, 120-6, and 120-2. Core 118-5 sees each of memory modules 120-5, 120-8, 120-6, and 120-2 as a unified region of memory (e.g., as a part of the local memory accessible to core 118-5). This facilitates data sharing among different DPEs 116 in DPE array 102. In other examples, core 118-5 may be directly connected to memory modules 120 in other DPEs.

DPEs 116 are interconnected by programmable interconnect circuitry. The programmable interconnect circuitry may include one or more different and independent networks. For example, the programmable interconnect circuitry may include a streaming network formed of streaming connections (shaded arrows), a memory mapped network formed of memory mapped connections (cross-hatched arrows). The memory mapped connections convey configuration data among DPEs 116. The term "configuration data," in reference to DPE array 102, refers to data used to program and/or configure cores 118 including program instructions stored in the program memories, and data written to the control registers within the DPEs 116 that control operation thereof. Suitable master circuits, e.g., PS 106 and/or PMC 110, may write to any addressable register within DPEs 116 (e.g., memory modules, program memory, and/or control registers) by way of the memory mapped connections.

The streaming connections are capable of communicating using packetized data (e.g., in contrast to establishing connectivity on a per-bit basis as is the case with PL 104). In general, application data is conveyed over the stream connections. The term "application data" refers to data that is operated on by a core 118 or generated by a core 118. The streaming connections may be programmed to operate as a circuit-switching streaming connections capable of implementing point-to-point, dedicated streams that are suitable for high-bandwidth communication among DPEs 116 or as packet-switching streaming connections where streams are shared to time-multiplex multiple logical streams onto one physical stream for medium bandwidth communication.

Loading configuration data into control registers of DPEs 116 by way of the memory mapped connections allows each DPE 116 and the components therein to be controlled independently. DPEs 116 may be enabled/disabled on a per-DPE basis. Each core 118, for example, may be configured to access the memory modules 120 as described or only a subset thereof to achieve isolation of a core 118 or a plurality of cores 118 operating as a cluster. Each streaming connection may be configured to establish logical connections between only selected ones of DPEs 116 to achieve isolation of a DPE 116 or a plurality of DPEs 116 operating as a cluster. Because each core 118 may be loaded with program code specific to that core 118, each DPE 116 is capable of implementing one or more different kernels therein.

In other aspects, the programmable interconnect circuitry within DPE array 102 may include additional independent networks such as a debug network that is independent (e.g., distinct and separate from) the streaming connections and the memory mapped connections, and/or an event broadcast network. In some aspects, the debug network is formed of memory mapped connections and/or is part of the memory mapped network.

Cores 118 may be directly connected with adjacent cores 118 via core-to-core cascade connections. In one aspect, core-to-core cascade connections are unidirectional and direct connections between cores 118 as pictured. In another aspect, core-to-core cascade connections are bidirectional and direct connections between cores 118. Activation of core-to-core cascade interfaces may also be controlled by loading configuration data into control registers of the respective DPEs 116.

In an example implementation, DPEs 116 do not include cache memories. By omitting cache memories, DPE array 102 is capable of achieving predictable, e.g., deterministic, performance. Further, significant processing overhead is avoided since maintaining coherency among cache memories located in different DPEs 116 is not required. In a further example, cores 118 do not have input interrupts. Thus, cores 118 are capable of operating uninterrupted. Omitting input interrupts to cores 118 also allows DPE array 102 to achieve predictable, e.g., deterministic, performance.

SoC interface block 122 operates as an interface that connects DPEs 116 to other resources of programmable device 100. In the example of FIG. 1, SoC interface block 122 includes a plurality of interconnected tiles 124 organized in a row. In particular embodiments, different architectures may be used to implement tiles 124 within SoC interface block 122 where each different tile architecture supports communication with different resources of programmable device 100. Tiles 124 are connected so that data may be propagated from one tile to another bi-directionally. Each tile 124 is capable of operating as an interface for the column of DPEs 116 directly above.

Tiles 124 are connected to adjacent tiles, to DPEs 116 immediately above, and to circuitry below using the streaming connections and the memory mapped connections as shown. Tiles 124 may also include a debug network that connects to the debug network implemented in DPE array 102. Each tile 124 is capable of receiving data from another source such as PS 106, PL 104, and/or another hardwired circuit block 112. Tile 124-1, for example, is capable of providing those portions of the data, whether application or configuration, addressed to DPEs 116 in the column above to such DPEs 116 while sending data addressed to DPEs 116 in other columns on to other tiles 124, e.g., 124-2 or 124-3, so that such tiles 124 may route the data addressed to DPEs 116 in their respective columns accordingly.

In one aspect, SoC interface block 122 includes two different types of tiles 124. A first type of tile 124 has an architecture configured to serve as an interface only between DPEs 116 and PL 104. A second type of tile 124 is has an architecture configured to serve as an interface between DPEs 116 and NoC 108 and also between DPEs 116 and PL 104. SoC interface block 122 may include a combination of tiles of the first and second types or tiles of only the second type.

PL 104 is circuitry that may be programmed to perform specified functions. As an example, PL 104 may be implemented as field programmable gate array type of circuitry. PL 104 can include an array of programmable circuit blocks. As defined herein, the term "programmable logic" means circuitry used to build reconfigurable digital circuits. Programmable logic is formed of many programmable circuit blocks sometimes referred to as "tiles" that provide basic functionality. The topology of PL 104 is highly configurable unlike hardwired circuitry. Each programmable circuit block of PL 104 typically includes a programmable element 126 (e.g., a functional element) and a programmable interconnect 142. The programmable interconnects 142 provide the highly configurable topology of PL 104. The programmable interconnects 142 may be configured on a per wire basis to provide connectivity among the programmable elements 126 of programmable circuit blocks of PL 104 and is configurable on a per-bit basis (e.g., where each wire conveys a single bit of information) unlike connectivity among DPEs 116, for example.

Examples of programmable circuit blocks of PL 104 include configurable logic blocks having look-up tables and registers. Unlike hardwired circuitry described below and sometimes referred to as hard blocks, these programmable circuit blocks have an undefined function at the time of manufacture. PL 104 may include other types of programmable circuit blocks that have also provide basic and defined functionality with more limited programmability. Examples of these circuit blocks may include digital signal processing blocks (DSPs), phase lock loops (PLLs), and block random access memories (BRAMs). These types of programmable circuit blocks, like others in PL 104, are numerous and intermingled with the other programmable circuit blocks of PL 104. These circuit blocks may also have an architecture that generally includes a programmable interconnect 142 and a programmable element 126 and, as such, are part of the highly configurable topology of PL 104.

Prior to use, PL 104, e.g., the programmable interconnect and the programmable elements, must be programmed or "configured" by loading data referred to as a configuration bitstream into internal configuration memory cells therein. The configuration memory cells, once loaded with a configuration bitstream, define how PL 104 is configured, e.g., the topology, and operates (e.g., particular functions performed). Within this disclosure, a "configuration bitstream" is not equivalent to program code executable by a processor or computer.

PS 106 is implemented as hardwired circuitry that is fabricated as part of programmable device 100. PS 106 may be implemented as, or include, any of a variety of different processor types each capable of executing program code. For example, PS 106 may be implemented as an individual processor, e.g., a single core capable of executing program code. In another example, PS 106 may be implemented as a multi-core processor. In still another example, PS 106 may include one or more cores, modules, co-processors, I/O interfaces, and/or other resources. PS 106 may be implemented using any of a variety of different types of architectures. Example architectures that may be used to implement PS 106 may include, but are not limited to, an ARM processor architecture, an x86 processor architecture, a graphics processing unit (GPU) architecture, a mobile processor architecture, a DSP architecture, combinations of the foregoing architectures, or other suitable architecture that is capable of executing computer-readable instructions or program code.

NoC 108 is a programmable interconnecting network for sharing data between endpoint circuits in programmable device 100. The endpoint circuits can be disposed in DPE array 102, PL 104, PS 106, and/or selected hardwired circuit blocks 112. NoC 108 can include high-speed data paths with dedicated switching. In an example, NoC 108 includes one or more horizontal paths, one or more vertical paths, or both horizontal and vertical path(s). The arrangement and number of regions shown in FIG. 1 is merely an example. NoC 108 is an example of the common infrastructure that is available within programmable device 100 to connect selected components and/or subsystems.

Within NoC 108, the nets that are to be routed through NoC 108 are unknown until a user circuit design is created for implementation within programmable device 100. NoC 108 may be programmed by loading configuration data into internal configuration registers that define how elements within NoC 108 such as switches and interfaces are configured and operate to pass data from switch to switch and among the NoC interfaces to connect the endpoint circuits. NoC 108 is fabricated as part of programmable device 100 (e.g., is hardwired) and, while not physically modifiable, may be programmed to establish connectivity between different master circuits and different slave circuits of a user circuit design. NoC 108, upon power-on, does not implement any data paths or routes therein. Once configured by PMC 110, however, NoC 108 implements data paths or routes between endpoint circuits.

For purposes of illustration, NoC 108 may include NoC master units (NMUs) 128, NoC slave units (NSUs) 130, a network 132, NoC peripheral interconnect (NPI) 134, and registers 136. Each NMU 128 is an ingress circuit that connects an endpoint circuit to NoC 108. Each NSU 130 is an egress circuit that connects NoC 108 to an endpoint circuit. NMUs 128 are connected to NSUs 130 through network 132. In an example, network 132 includes NoC packet switches 138 (NPSs) and routing 140 between NPSs 138. Each NPS 138 performs switching of NoC packets. NPSs 138 are connected to each other and to NMUs 128 and NSUs 130 through routing 140 to implement a plurality of physical channels. NPSs 138 also support multiple virtual channels per physical channel.

NPI 134 includes circuitry to program NMUs 128, NSUs 130, and NPSs 138. For example, NMUs 128, NSUs 130, and NPSs 138 can include registers 136 that determine functionality thereof. NPI 134 includes a peripheral interconnect coupled to registers 136 for programming thereof to set functionality. Registers 136 in NoC 108 support interrupts, Quality of Service (QoS), error handling and reporting, transaction control, power management, and address mapping control. Registers 136 can be initialized in a usable state before being reprogrammed, such as by writing to the registers 136 by PMC 110 using write requests. Configuration data for NoC 108 can be stored in a non-volatile memory (NVM), e.g., as part of a device image, and provided to NPI 134 for programming NoC 108 and/or other endpoint circuits. NPI 134 may also be used by PMC 110 to program one or more of hardwired circuit blocks 112.

Endpoint circuits coupled to NMUs 128 and NSUs 130 can be hardened circuits (e.g., hardwired circuit blocks 112), circuits implemented in PL 104, components in PS 106, and/or circuitry in DPE array 102. A given endpoint circuit can be coupled to more than one NMU 128 or more than one NSU 130. In the example, endpoint circuits are connected to other endpoint circuits through NoC 108. For example, master endpoint circuits couple to NMUs 128. Slave endpoint circuits couple to NSUs 130.

Network 132 includes a plurality of physical channels. The physical channels are implemented by programming NoC 108. Each physical channel includes one or more NPSs 138 and associated routing 140. NPSs 138 are coupled to each other to form a matrix of switches. An NMU 128 connects with an NSU 130 through at least one physical channel and optionally one or more virtual channels. Connections through network 132 use a master-slave arrangement. In an example, the most basic connection over network 132 includes a single master connected to a single slave. However, in other examples, more complex structures can be implemented.

NoC 108 may be programmed and/or used as part of a larger boot or programming process or programmed independently of other resources of programmable device 100. In general, programming NoC 108 may include PMC 110 receiving NoC configuration data at boot time and loading the configuration data therein at boot time. NoC 108 may also be programmed at runtime. The NoC programming data may be a part of a device image.

PMC 110 is responsible for managing programmable device 100. PMC 110 is a subsystem within programmable device 100 that is capable of managing the other programmable circuit resources across the entirety of programmable device 100. PMC 110 is capable of maintaining a safe and secure environment, booting programmable device 100, and managing programmable device 100 during normal operations. For example, PMC 110 is capable of providing unified and programmable control over power-up, boot/configuration, security, power management, safety monitoring, debugging, and/or error handling for the different programmable circuit resources of programmable device 100 (e.g., DPE array 102, PL 104, PS 106, and NoC 108). PMC 110 operates as a dedicated platform manager that decouples PS 106 and from PL 104. As such, PS 106 and PL 104 may be managed, configured, and/or powered on and/or off independently of one another.

In one aspect, PMC 110 is capable of operating as a Root-of-Trust for the entirety of programmable device 100. As an example, PMC 110 is responsible for authenticating and/or validating device images containing configuration data for any of the programmable resources of programmable device 100 that may be loaded into programmable device 100. PMC 110 further is capable of protecting programmable device 100 against tampering during operation. By operating as the Root-of-Trust for programmable device 100, PMC 110 is capable of monitoring operation of PL 104, PS 106, and/or any other programmable circuit resources that may be included in programmable device 100. The Root-of-Trust capabilities, as performed by PMC 110, are distinct and separate from PS 106 and PL 104 and/or any operations performed by the PS 106 and/or PL 104.

In one aspect, PMC 110 is operated on a dedicated power supply. As such, PMC 110 is powered by a power supply that is separate and independent from the power supply of PS 106 and the power supply of PL 104. This power independence allows PMC 110, PS 106, and PL 104 to be protected from one another in terms of electrical noise and glitches. Further, one or both of PS 106 and PL 104 may be powered down (e.g., suspended or placed in hibernate mode) while PMC 110 continues to operate. This capability allows any portions of programmable device 100, e.g., PL 104, PS 106, NoC 108, etc., that have been powered down to wake and be restored to an operational state more quickly and without the need for the entirety of programmable device 100 to undertake a complete power-up and boot process.

PMC 110 may be implemented as a processor with dedicated resources. PMC 110 may include multiple redundant processors. The processors of PMC 110 are capable of executing firmware. Use of firmware supports configurability and segmentation of global features of programmable device 100 such as reset, clocking, and protection to provide flexibility in creating separate processing domains (which are distinct from "power domains" that may be subsystem-specific). Processing domains may involve a mixture or combination of one or more different programmable circuit resources of programmable device 100 (e.g., wherein the processing domains may include different combinations or devices from DPE array 102, PS 106, PL 104, NoC 108, and/or other hardwired circuit blocks 112).

Hardwired circuit blocks 112 include special-purpose circuit blocks fabricated as part of programmable device 100. Though hardwired, hardwired circuit blocks 112 may be configured by loading configuration data into control registers to implement one or more different modes of operation. Examples of hardwired circuit blocks 112 may include input/output (I/O) blocks, transceivers for sending and receiving signals to circuits and/or systems external to programmable device 100, memory controllers, or the like. Examples of different I/O blocks may include single-ended and pseudo differential I/Os. Examples of transceivers may include high-speed differentially clocked transceivers. Other examples of hardwired circuit blocks 112 include, but are not limited to, cryptographic engines, digital-to-analog converters (DACs), analog-to-digital converters (ADCs), and the like. In general, hardwired circuit blocks 112 are application-specific circuit blocks.

CFI 114 is an interface through which configuration data, e.g., a configuration bitstream, may be provided to PL 104 to implement different user-specified circuits and/or circuitry therein. CFI 114 is coupled to and accessible by PMC 110 to provide configuration data to PL 104. In some cases, PMC 110 is capable of first configuring PS 106 such that PS 106, once configured by PMC 110, may provide configuration data to PL 104 via CFI 114. In one aspect, CFI 114 has a built in cyclic redundancy checking (CRC) circuitry (e.g., CRC 32-bit circuitry) incorporated therein. As such, any data that is loaded into CFI 114 and/or read back via CFI 114 may be checked for integrity by checking the values of codes attached to the data.

The various programmable circuit resources illustrated in FIG. 1 may be programmed initially as part of a boot process for programmable device 100. During runtime, the programmable circuit resources may be reconfigured. In one aspect, PMC 110 is capable of initially configuring DPE array 102, PL 104, PS 106, and NoC 108. At any point during runtime, PMC 110 may reconfigure all or a portion of programmable device 100. In some cases, PS 106 may configure and/or reconfigure PL 104 and/or NoC 108 once initially configured by PMC 110.

Figure 2:
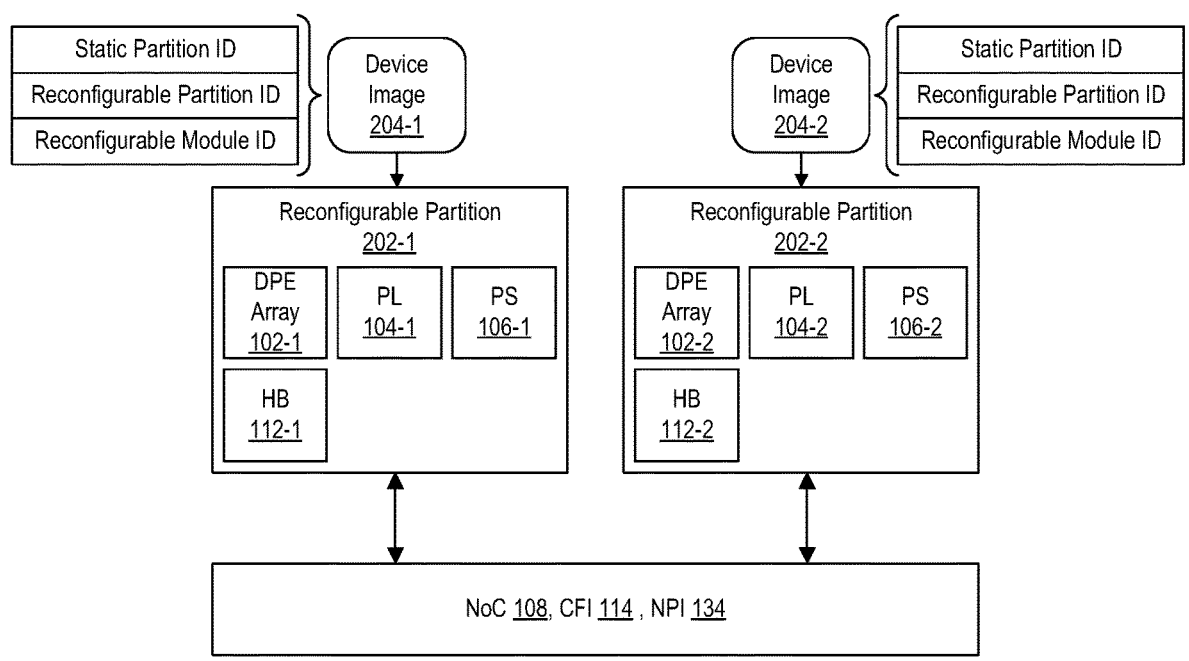
FIG. 2 illustrates certain structural and functional aspects of the programmable device of FIG. 1.

FIG. 2 illustrates certain structural and functional aspects of programmable device 100. The example of FIG. 2 illustrates how programmable device 100 may be used for partial reconfiguration. Partial reconfiguration is a process where a region of particular programmable circuit resources within programmable device 100 called a reconfigurable partition (e.g., a processing domain) may be dynamically reconfigured by loading different programming data into programmable device 100 for that region over time. As defined herein, the term "reconfigurable partition" means a group of programmable circuit resources of programmable device 100 (e.g., tiles and/or sites of programmable device 100) in which one or more reconfigurable modules can be placed (e.g., implemented). In this regard, a reconfigurable partition refers to a physical region of programmable device 100 that may be loaded with one or more different reconfigurable modules. As defined herein, the term "reconfigurable module" means the programming data used to program a group of resources on a programmable device such as programmable device 100 within a particular reconfigurable partition.

The reconfigurable module(s) for a reconfigurable partition may specify a different user application than was previously implemented in the reconfigurable partition. The reconfigurable module(s) do not specify new and/or different circuitry for programmable circuit resources of programmable device 100 that are outside of the reconfigurable partition or in a different reconfigurable partition. Thus, one or more reconfigurable partitions may undergo modification through partial reconfiguration repeatedly and independently of one another while other reconfigurable partitions of the programmable device 100 that may be programmable continue to operate without interruption.

In the example of FIG. 2, programmable device 100 is configured to implement a plurality of reconfigurable partitions 202-1 and 202-2. The particular number of reconfigurable partitions is for purposes of illustration and not limitation. Programmable device 100 may be configured to implement more reconfigurable partitions than shown. Further, programmable device 100 may be configured as a single, larger partition.

In the example of FIG. 2, programmable device 100 may be initially configured to implement a platform. A platform is circuitry of programmable device 100 that connects to the different reconfigurable partitions 202 on programmable device 100 and provides the reconfigurable modules therein with interfaces to communicate with other portions of programmable device 100 external to the reconfigurable partition and/or resources external to programmable device 100.

In one aspect, the platform is implemented as static circuitry. Static circuitry refers to programmable circuit resources of programmable device 100 that are not modified or changed as are circuits and/or systems in reconfigurable partitions 202. Thus, the platform is capable of operating uninterrupted while programmable circuit resources in reconfigurable partitions 202 may be dynamically changed (e.g., at runtime) over time. For example, the platform may provide general infrastructure such as connectivity to memory controllers to connect to external memory, infrastructure to connect to other networks, a host system, or the like that may be used by user applications implemented in reconfigurable partitions 202. These connections may remain active, being in static circuitry and part of the platform, while one or more or all of the reconfigurable partitions 202 undergo reconfiguration.

Each reconfigurable partition 202 can have one or more associated reconfigurable modules implemented therein. The particular reconfigurable modules that may be loaded in the reconfigurable partition, which specify the user application, may change over time. Each reconfigurable partition 202 may be reprogrammed to perform different functions and/or operations over time based on the particular reconfigurable module(s) implemented therein.

In the example of FIG. 2, each reconfigurable partition includes a portion of DPE array 102, a portion of PL 104, and one or more hardwired circuit blocks 112. As shown, reconfigurable partition 202-1 includes a portion of DPE array 102 (e.g., one or more DPEs 116) shown as DPE array 102-1, one or more circuit blocks implemented in PL 104-1, one or more components of PS 106 shown as PS 106-1 (e.g., one or more real time processors of PS 106), and one or more hardwired circuit blocks 112-1. Reconfigurable partition 202-2 includes a different portion of DPE array 102 (e.g., one or more other DPEs 116) shown as DPE array 102-2, one or more other circuit blocks implemented in PL 104-2, one or more other components of PS 106 shown as PS 106-2 (e.g., one or more application processors of PS 106), and one or more other hardwired circuit blocks 112-2.

It should be appreciated that while NoC 108 is illustrated external to reconfigurable partitions 202, portions of NoC 108 may be used to connect DPE array 102-1, PL 104-1, PS 106-1, and HCB 112-1, while other portions of NoC 108 may be used to connect DPE array 102-2, PL 104-2, PS 106-2, and HCB 112-2, while still other portions of NoC 108 are part of the platform. Data paths through NoC 108 corresponding to different reconfigurable partitions may remain isolated from one another.

FIG. 2 is provided for purposes of illustration and not limitation. In this regard, some reconfigurable partitions may not include any portion of DPE array 102, may not include any portion of PL 104, may not include any portion of PS 106, and/or may not include any hardwired circuit blocks 112. In any case, where programmable device 100 implements a plurality of reconfigurable partitions, each reconfigurable partition may be logically isolated from the other.

In one aspect, each reconfigurable module loaded into a reconfigurable partition is specified as a device image 204 (e.g., a file of configuration data). Each device image 204 may include one or more segments. Each segment corresponds to a different portion of programmable device 100 that is used or included in the reconfigurable partition in which the reconfigurable module is to be implemented. For example, a reconfigurable module that uses at least a portion of each of DPE array 102, PL 104, PS 106, NoC 108, and a hardwired circuit block 112 will include a segment corresponding to DPE array 102, a segment corresponding to PL 104, a segment corresponding to PS 106, a segment corresponding to NoC 108, and a segment corresponding to the hardwired circuit block 112, where each segment contains the programming and/or configuration data for programming the corresponding programmable circuit resource or portion thereof included in the reconfigurable partition.

Referring to FIG. 2, for example, device image 204-1 will include a segment to program DPE array 102-1, a segment to program PL 104-1, a segment to program PS 106-1, and a segment to program hardwired circuit block 112-1. Similarly, device image 204-2 will include a segment to program DPE array 102-2, a segment to program PL 104-2, a segment to program PS 106-2, and a segment to program hardwired circuit block 112-2.

In one aspect, each device image 204 may be created to include one or more identifiers (IDs). Examples of the IDs within in each device image may include a static partition ID, a reconfigurable partition ID, and a reconfigurable module ID. The static partition ID specifies a particular platform with which a given device image is compatible. Each static partition ID may be unique and, as such, uniquely identify a particular platform (e.g., where different platforms provide different connectivity, different resources, and/or support different numbers of reconfigurable partitions). The reconfigurable partition ID specifies a particular reconfigurable partition in the programmable device that the device image may be used to configure (e.g., the reconfigurable partition in which the device image is to be implemented). The reconfigurable module ID specifies a particular reconfigurable module. The reconfigurable partition ID may uniquely identify a particular reconfigurable partition implemented by a given platform. The reconfigurable module ID may uniquely identify a particular reconfigurable module.

For example, when reconfigurable modules are created, each is created (e.g., using design tools) for operability with a particular platform. As noted, the static partition ID, which may also be referred to as a platform ID since the static partition ID indicates a particular platform, is a unique identifier indicating a particular platform. Each reconfigurable module may include the static partition ID (e.g., platform ID) for the particular platform with which the reconfigurable module is intended to operate. The reconfigurable module will also include a reconfigurable module ID unique to that reconfigurable module. The device image that includes the reconfigurable module will include the static partition ID and the reconfigurable module ID.

PMC 110 may load a device image specifying a platform (e.g., a "platform device image"). The platform device image will include a static partition ID that uniquely identifies the platform from other platforms. The platform device image may also include a list of the one or more reconfigurable partitions (e.g., reconfigurable partition IDs) implemented by that platform, and one or more reconfigurable modules (reconfigurable module IDs) that are compatible with each (e.g., that may be implemented in each) respective reconfigurable partition. Upon loading the platform device image, PMC 110 may extract the information noted and store/maintain the information as trace data for the platform.

As such, PMC 110, upon loading a device image that specifies a reconfigurable module, is capable of verifying that the device image is compatible with the platform. The device image for the reconfigurable module, for example, may specify the static partition ID for the particular platform with which the device image is intended to be used, the reconfigurable partition ID indicating the particular reconfigurable partition implemented by the platform in which the reconfigurable module is to be implemented, and a reconfigurable module ID uniquely identifying the particular reconfigurable module specified by the device image. PMC 110, for example, may compare the static partition ID of the platform with the static partition ID of the device image to ensure that the device image being loaded is compatible with the platform currently implemented in programmable device 100. PMC 110 may also check that the reconfigurable partition ID of the device image corresponds to a reconfigurable partition implemented by the platform and the particular reconfigurable partition that is to be reconfigured using the device image. PMC 110 may also check that the reconfigurable module ID of the device image is one that is compatible with the reconfigurable partition ID of the platform, e.g., is listed in association with the particular reconfigurable partition that the device image is to configure.

As an illustrative and non-limiting example, if a host system (e.g., a computer system in which programmable device 100 operates as an accelerator) attempts to load a device image into programmable device 100 that was designed and intended to operate with a different platform than what is currently loaded in programmable device 100, PMC 110 is capable of rejecting the device image, generating an error code, and persisting the error code in a programming access trace data (PATD) register.

Accordingly, in one aspect, as PMC 110 loads further device images, PMC 110 checks that the device images are compatible with the particular platform implemented therein and the particular reconfigurable partition of the platform. For example, as PMC 110 loads device image 204-1, PMC 110 may check that the static partition ID of device image 204-1 matches the static partition ID of the platform implemented in programmable device 100. PMC 110 further checks that the reconfigurable partition ID specified in device image 204-1 matches the reconfigurable partition ID of the particular reconfigurable partition (e.g., 202-1) in which device image 204-1 is to be implemented. PMC 110 may further check that the reconfigurable module ID of device image 204-1 matches the allowed reconfigurable module IDs of reconfigurable partition 202-1.

Similarly, PMC 110 may check that the static partition ID of device image 204-2 matches the static partition ID of the platform implemented in programmable device 100. PMC 110 further checks that the reconfigurable partition ID specified in device image 204-2 matches the reconfigurable partition ID of the particular reconfigurable partition (e.g., 202-2) in which device image 204-2 is to be implemented.

PMC 110 may further check that the reconfigurable module ID of device image 204-2 matches the allowed reconfigurable module IDs of reconfigurable partition 202-2.

Figure 3:
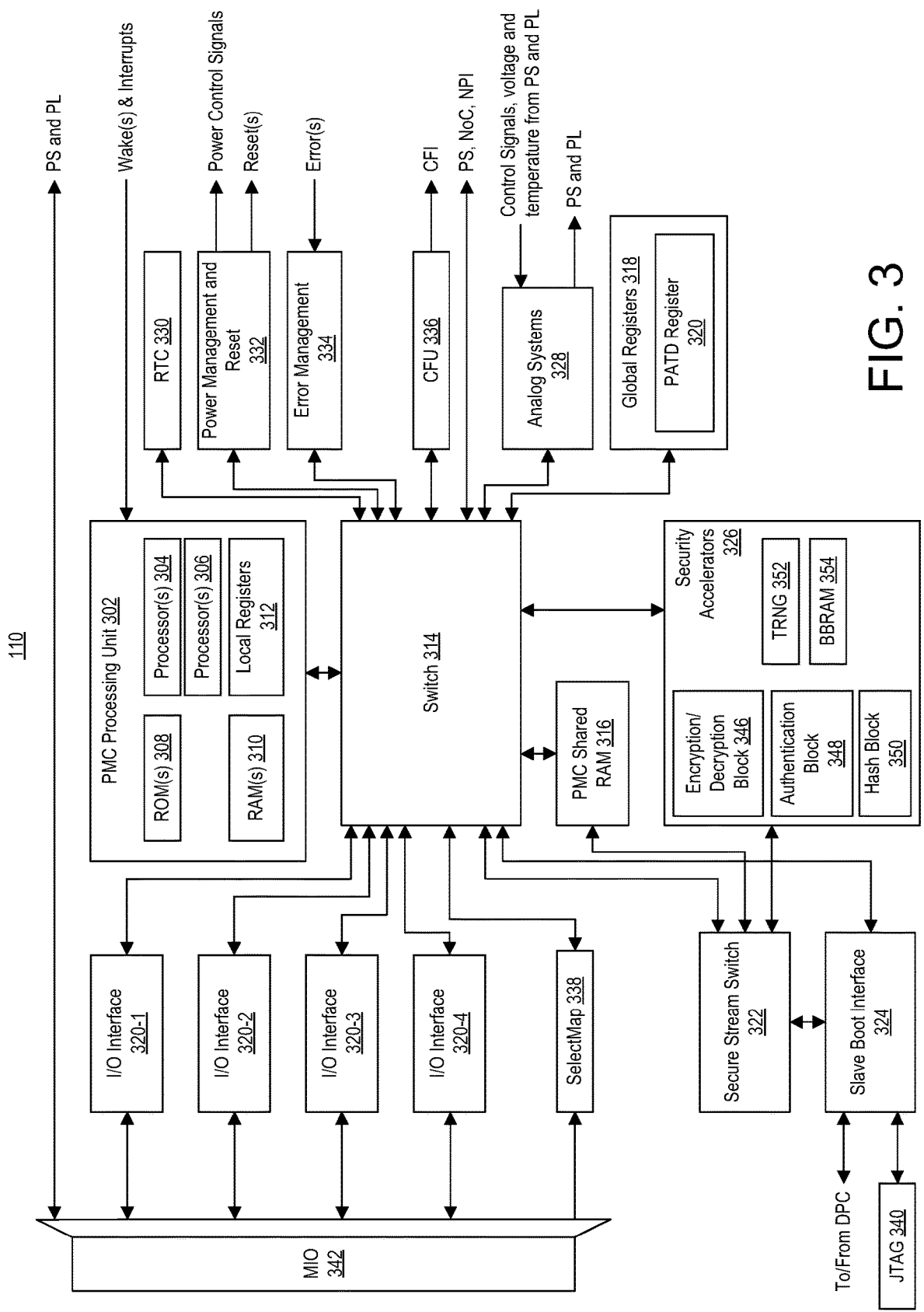
FIG. 3 illustrates an example implementation of a platform management controller (PMC) described in connection with FIG. 1.

FIG. 3 illustrates an example implementation of PMC 110. In the example of FIG. 3, PMC 110 includes a PMC processing unit 302 (being separate and distinct from PS 106). PMC processing unit 302 can include one or more processors such as processor 304 and processor 306. PMC processing unit 302 further includes one or more ROMs 308, one or more RAM(s) 310, and local registers 312. ROM(s) 308 and RAM(s) 310 are accessible only by processors within PMC processing unit 302, e.g., processors 304, 306.

In one aspect, each of processors 304 and 306 is implemented as a redundant processor (e.g., a triple redundant processor) capable of operating in lockstep using appropriate voting circuitry. In another aspect, processor 304 is dedicated to accessing (e.g., executing code stored in) ROM(s) 308, while processor 306 is dedicated to executing code stored in RAM(s) 310. In another aspect, each processor 304, 306 has a ROM 308 and a RAM 310 so that each processor 304, 306 has an independent and dedicated ROM 308 and an independent and dedicated RAM 310. FIG. 3 is provided for purposes of illustration and not limitation. In this regard, PMC processing unit 302 may include a single processor.

RAM 310 may be protected with error correction coding (ECC) circuitry. Processors 304, 306 may be used to power up and configure programmable device 100 by first executing trusted code stored in ROM(s) 308. In executing the trusted code stored in ROM(s) 308, processors 304, 306 may then load firmware from a main boot device into RAM(s) 310. Local registers 312 are configuration registers for PMC processing unit 302 and may only be accessed by PMC processing unit 302.

One aspect of having PMC 110 operate as the Root-of-Trust of programmable device 100 is using the code stored in ROM(s) 308 to load firmware into RAM(s) 310. Processor 304, for example, is capable of executing the code from ROM(s) 308 to initiate operations such as authentication and validation of any firmware loaded into programmable device 100 to be executed by processor(s) 306 and/or of any device images loaded into programmable device 100. Accordingly, any device image that is used to configure and/or program any portion of programmable device 100 may first be authenticated and/or validated by PMC 110.

Post boot, processors 304, 306 are capable of performing a variety of different functions using the various components contained in PMC 110 under control of the firmware. For example, processors 304, 306 are capable of performing power-management, voltage and temperature monitoring, safety and security event response, and error management. Processors 304, 306 further are capable of controlling configuration of programmable device 100 by controlling the loading and unloading of device images. In one aspect, any device image loaded into programmable device 100 is loaded or unloaded under control of PMC 110.

PMC processing unit 302 is connected to switch 314. PMC processing unit 302 is capable of communicating with other components within PMC 110 and programmable device 100 by way of switch 314. Switch 314 may include a plurality of memory mapped switches and/or a plurality of stream switches. Switch 314 is connected to PMC shared RAM 316, global registers 318, I/O interface(s) 320 (e.g., 320-1, 320-2, 320-3, and 320-4), secure stream switch 322, slave boot interface (SBI) 324, security accelerators 326, analog systems 328, Real-time Clock (RTC) 330, power management and reset 332, error management 334, Configuration Frame Unit (CFU) 336, and a SelectMap interface 338. SBI 324 is connected to a JTAG port 340.

PMC shared RAM 316 may be used to store configuration data (e.g., a device image) for programmable device 100 during processing and as general-purpose data-processing RAM for PMC 110. Global registers 318 are configuration registers that are accessible by any (e.g., all) masters in PMC 110. Global registers 318 may include general-purpose, power control, error management registers, and a service interrupt request interface.

In one aspect, global registers 318 include a PATD register 320. PATD register 320 is capable of storing trace data corresponding to the different device images loaded and unloaded by PMC processing unit 302 for programmable device 100 over time. For example, PMC processing unit 302 is capable of storing information relating to each device image that is loaded into programmable device 100 in PATD register 320. As PMC processing unit 302 loads a new and/or different device image into programmable device 100, the existing information stored in PATD register 320 may be moved into a memory that has been allocated for storage of trace data. The memory may be PMC shared RAM 316, another memory in programmable device 100 (e.g., BRAM allocated in PL 104), or RAM that is external to programmable device 100. Once the existing or old trace data is moved out of PATD register 320, new trace data may be stored therein overwriting the prior trace data.

I/O interfaces 320 may be coupled to a multiplexed input/output (MIO) 342. MIO 342 is also connected to SelectMap 338, PS 106, and PL 104. MIO 342 is capable of selectively connecting I/O signals of programmable device 100 to SelectMap 338, PS 106, PL 104, and/or to I/O interfaces 320. Examples of I/O interfaces 320 include, but are not limited to, I2C and one or more flash interfaces such as Serial Peripheral Interface (SPI), SD/eMMC, and Universal Serial Bus (USB). MIO 342 provides connectivity to I/O pins of programmable device 100 that are capable of serving multiple different functions depending on configuration. For example, MIO 342 may be configured to connect signals to SelectMap 338 for configuration or to I/O interfaces 320 such as a flash memory interface and/or a USB interface.

Secure stream switch 322 ensures that data streams, which may convey device images, provided to security accelerators 326 for processing are secure. SBI 324 facilitates slave boot of programmable device 100. Though not shown, SBI 324 may be connected to SelectMap 338 and NoC 108.

Security accelerators 326 can include an encryption/decryption block 346 capable of performing encryption and/or decryption, an authentication block 348 capable of performing authentication, and a hash block 350 capable of generating hashes on received data. In one example, encryption/decryption block 346 is a symmetric key cryptography engine capable of performing Advanced Encryption Standard (AES) using Galois Counter Mode (GCM) (AES-GCM). In an example, authentication block 348 is capable of performing public-key cryptography. For example, authentication block 348 is capable of implementing the Elliptic Curve Digital Signature Algorithm and/or Rivest-Shamir-Adleman. Hash block 350 is capable of performing Secure Hash Algorithm 3/394. Security accelerators 326 may also include a true random number generator (TRNG) circuit 352 capable of generating random numbers and a battery-backed RAM (BBRAM) 354 circuit block. The particular circuit blocks included in security accelerators 326 are provided for purposes of illustration and not limitation. In one aspect, only blocks 346, 348, and 350 of security accelerators 326 are accessible via secure stream switch 322, while blocks 352 and 354 are accessible by switch 314.

Analog systems 328 can include a system monitor capable of monitoring voltage and temperature from one or more remote system monitor circuits that may be located at various places and/in various subsystems around programmable device 100; system oscillator(s) capable of generating the clock signal for PMC 110; e-fuse controller capable of maintaining and/or managing e-fuse circuitry on the programmable device 100; bandgap circuitry capable of generating one or more reference voltages for analog devices in the programmable device 100 such as DACs and/or ADCs that may be implemented on programmable device 100 as hardwired and programmable circuit blocks; one or more phase lock-loops (PLLs) capable of generating clock signals for PMC 110, NoC 108, NPI 134, and PS 106; and a Power-On-Reset (POR) circuit.

RTC 330 is a clock circuit that is capable of operating on a highly accurate crystal oscillator. RTC 330 may be used to measure current time and generate alarms at specific times for various operating system and device management functions within programmable device 100. Power management and reset circuitry 332 implements the logic and interfaces necessary to control power-islands, power domains, and resets to other circuit blocks on programmable device 100. Power management and reset circuitry 332 further connects to PS 106 to control power domains and islands implemented in PS 106.

Error management circuitry 334 is capable of receiving, recording, and responding to errors from other programmable resources (e.g., subsystems) within programmable device 100. For example, error management circuitry 334 is capable of capturing errors from all over programmable device 100. Error management circuitry 334 may be programmed by PMC 110 to generate certain events, e.g., interrupts, in PMC 110 in response to particular received errors and/or combinations of errors. PMC 110 is capable of servicing errors in response to events generated by error management circuitry 334.

CFU 336 is coupled to CFI 114 and is capable of performing configuration and readback of configuration data provided or loaded into configuration registers of PL 104 by way of CFI 114. PMC 110, for example, transfers the PL programming data (e.g., a configuration bitstream) through CFU 336 to CFI 114 to configure PL 104.

Secure stream switch 322 may be used to stream configuration data, e.g., a device image, into programmable device 100. For example, a device image may be pushed to SelectMap interface 338 via MIO 342. A device image may also be received through JTAG port 340. In any case, the device image is pushed to SBI 324, which may generate an interrupt to PMC processing unit 302. PMC processing unit 302 is capable of transferring the device image from SBI 324 through secure stream switch 322 to PMC shared RAM 316 for further processing.

PMC 110, being the Root-of-Trust for programmable device 100, is tasked with loading device images that program the various portions of programmable device 100 for operation. For example, for any of DPE 102, PL 104, PS 106, and/or NoC 108 to operate, PMC 110 first must load a device image that is used to program such components. PMC 110 is capable of authenticating the device images and/or validating the device images once loaded and prior to using the device images to program any of the programmable circuit resources of programmable device 100. PMC processing unit 302 may push the data to PL 104 by way of CFU 336 to CFI 114, to PS 106, to NPI 134 and/or NoC 108, and to DPE array 102 for programming of the respective programmable circuit resources of programmable device 100.

For example, to create a processing domain (e.g., a reconfigurable partition) that includes one or more DPEs 116, one or more circuit blocks implemented in PL 104, one or more hardwired circuit blocks 112, and that communicate via NoC 108, PMC 110 must load one or more device images into programmable device 100 and use the device images to program the respective programmable circuit resources. For each different reconfigurable partition implemented in programmable device 100, of which a plurality may exist concurrently at any given time, each reconfigurable partition may require the loading of a device image.

PMC 110 may continually load and unload device images over time. Further, the device images may be loaded through any of a variety of different pathways. For example, one or more device images may be loaded into PMC 110 through one or more of I/O interfaces 320-1, 320-2, 320-3, and/or 320-4, SelectMap 338, JTAG port 340, and/or received by another controller (e.g., a PCIe interface) implemented in PS 106 which is connected to a host system. In another example, device images may be received via I/O interfaces (e.g., memory controllers connected to off-chip RAM, an Ethernet interface, etc.) implemented using one or more hardwired circuit blocks 112. In each case, PMC 110 is tasked with authenticating and validating the device images using security accelerators 326 prior to using the device images to program the various portions of programmable device 100.

FIG. 3 is provided for purposes of illustration. In this regard, PMC 110 may include fewer components than shown (e.g., a processor and memory along with PATD register 320) or additional components not illustrated in FIG. 3. Further, PMC 110 may have a different architecture than illustrated.

Table 1 below illustrates different types of information that may be collected by a processor in PMC 110 (e.g., processor 304 and/or 306 in PMC processing unit 302) as part of handling device images for programmable device 100. In one aspect, the information illustrated in Table 1 may be stored by the processor within PATD register 320 each time a device image is loaded. Data determined when the device image is unloaded may be stored at a later time, e.g., written to the PATD register 320 or to a memory allocated to store trace data offloaded from PATD register 320.

TABLE 1

| Field | Bit Width | Notes |
|---|---|---|
| Programming Access ID | 8 | Identifier assigned to a partial reconfiguration agent during system definition. If there is no access granted, the field will be all 0s. |
| Device Image Segment ID | 10 | Identifies device image segment (e.g., partition) that contains the partial |

TABLE 1-continued

| Field | Bit Width | Notes |
|---|---|---|
| | | reconfiguration data. The identifier comes from the requesting partial reconfiguration agent. All 0s indicates that no device image was loaded. |
| Reconfigurable Partition ID | 8 | Identifier comes from the device image. All 0s if no device image was loaded or if not applicable. |
| Reconfigurable Module ID | 8 | Identifier comes from the device image. All 0s if no device image was loaded or if not applicable. |
| Static Partition ID | 8 | Identifier for a particular static partition in a device image (e.g., a particular platform). |
| Master ID | 16 | Master identifier of device image data source. |
| Access Denied - Unknown Master | 1 | Set to 0 initially and set to 1 if a master not on the whitelist table makes an access request (and is therefore denied). |
| CFI CRC Error | 1 | Set to 1 if a CRC error occurred on the CFI. |
| NPI SHA3 Error | 1 | Set to 1 if an SHA error occurred on the NPI. |
| Release Request | 1 | Set to 1 if there was a request to release the access grant. |
| Access Termination Code | 3 | Code that identifies the reason for access termination. All 0s if access ended normally. Examples are timeout, high-priority interrupt, or agent self-termination. |
| CFI Partition Data Write | 1 | Indicates that data was written to the CFI. Can be used by SEM FW to determine if re-initialization is required. |
| NPI Partition Data Write | 1 | Indicates that data was written to the NPI. Can be used by SEM FW to determine if NPI read descriptors have been updated. |
| Access Event Count | 8 | Tracks the number of access events. |
| Access Event End Time | 32 | System time at which this event ended (i.e., when device image was loaded). |
| Fallback | 1 | Set to 1 if a fallback device image was used. |
| Interrupted Function | 5 | Code that identifies a function that was interrupted. All 0s if none. |
| Area Region | Variable | PL area region coordinates used by device image. |
| Unload Time | 32 | System time at which device image was unloaded. |

The particular fields and sizes described in connection with Table 1 are provided for purposes of illustration. The number of bits and the example fields are not intended to be limiting of the trace data stored in PATD register 320. In some cases, the particular combination of fields stored in PATD register 320 from Table 1 may vary (e.g., be fewer than shown). In other cases, the trace data stored in PATD register 320 may include any combination of fields from Table 1 (including all such fields) and include other information as described within this disclosure.

In one aspect, the "Release Request" field indicates the particular agent (e.g., entity) that is trying to load a reconfigurable module. Multiple agents may try to load reconfigurable modules. Access for loading reconfigurable modules is arbitrated so that only agent or requestor one may do so at a time. The Release Request field indicates that one agent requested access for loading a reconfigurable module while another agent already had access. The agent with access, for example, may be configured to poll the register to determine whether another agent has requested access. The agent with access may, when safe to do so, relinquish access so as to provide the requesting agent with access. In some cases, certain agents such as the Single Event Monitor (SEM) may access configuration memory permanently and be informed, through polling of the release request field, that another agent desires access. The release request field may also provide a mechanism to force the release of access permission in the case of an agent becoming hung. The Release Request field may also be used to allow one agent to "cut into the line" before another agent in the case of a high-priority event.

The "Access Termination Code" field is related to the release request field in that the Access Termination Code field records a code indicating the reason an agent lost access to the configuration memory. As an example, if agent A had access but did not respond to requests from PMC 110 inquiring whether agent A was still alive or responsive, PMC 110 may determine that agent A is hung. PMC 110 may then terminate agent A's access.

The "Fallback Field" indicates the occurrence of a device image failing to load and, in response, PMC 110 using a known good image as a fallback or failsafe. The Fallback Field indicates that a known good fallback device image was used to configure some portion of programmable device 100. The "Interrupted Function" field tracks whether a request to load a device image interrupted another operation. Examples of operations that if interrupted may be indicated in the Interrupted Function field include, but are not limited to, an SEM operation, a security monitor operation, or the like. The Interrupt Function field may be helpful for determining the cause of a failure to load a device image.

The "Access Denied—Unknown Master" field is initially set to 0. In response to PMC 110 determining that the requesting master (e.g., the master requesting partial reconfiguration) is not permitted to make such requests, e.g., the requesting master is not specified on a list of allowed masters maintained by PMC 110 referred to as the "whitelist," PMC 110 sets the field to 1. In this regard, PMC 110 is capable of tracking successful requests and unsuccessful requests from masters by virtue of whether the Access Denied—Unknown Master field is set to 0 or 1. In the case of a successful request, further details relating to the loading of the PDI are also tracked as explained herein and illustrated in the other fields within Table 1. It also should be appreciated that other information not illustrated in Table 1 relating to the requesting master may be stored.

Figure 4:
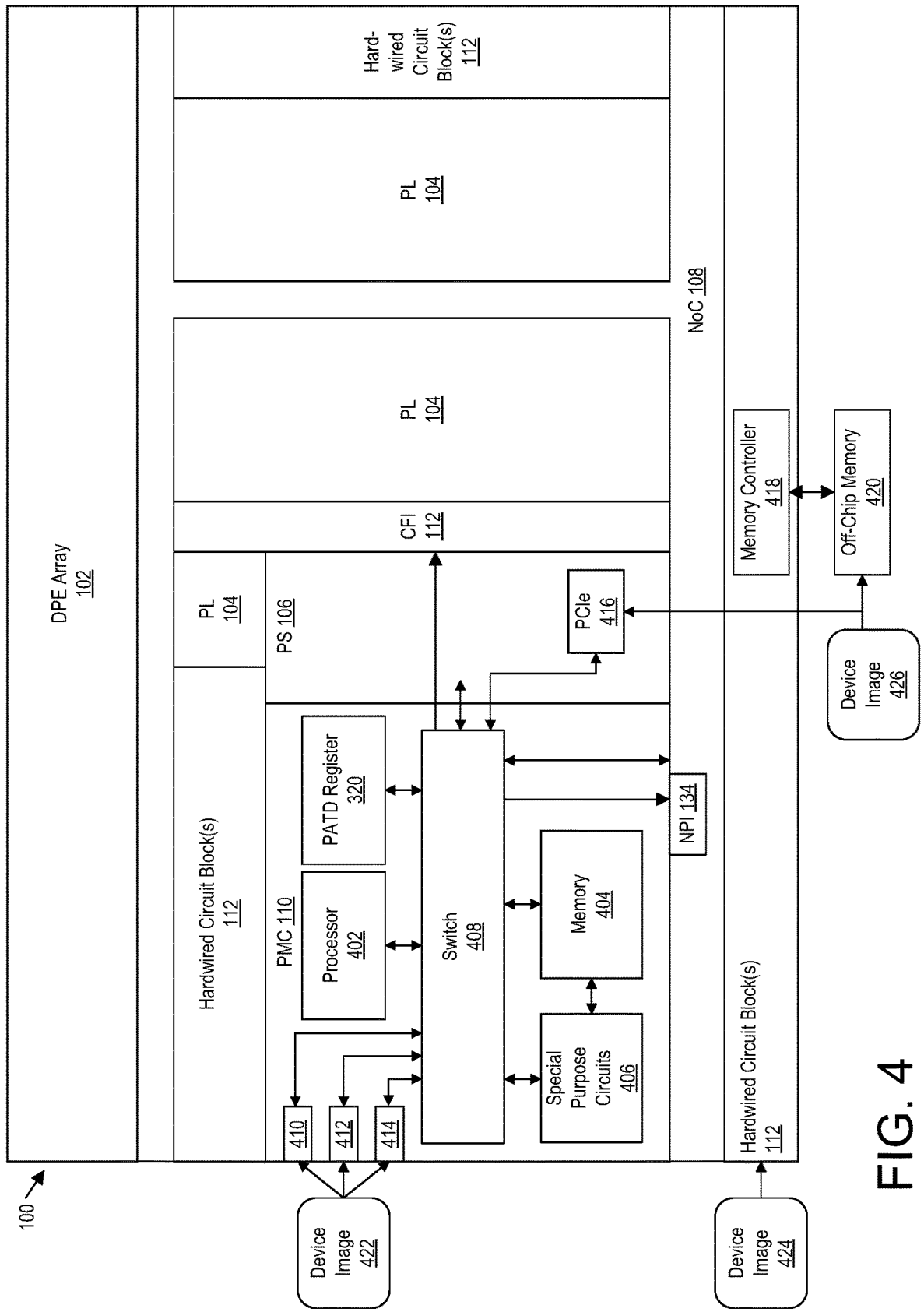
FIG. 4 illustrates another example architecture for a programmable device.

FIG. 4 illustrates another example architecture for programmable device 100. The example of FIG. 4 illustrates a simplified architecture for PMC 110. Further, the example of FIG. 4 illustrates a plurality of different ways, e.g., communication paths, through which a device image may be loaded into programmable device 100. In one aspect, the particular communication path through which a device image is loaded into programmable device 100 may be detected and stored as part of the trace data.

In the example of FIG. 4, PMC 110 includes a processor 402, PATD register 320, a memory 404, optionally one or more special purpose circuits 406, each connected to a switch 408. PMC 110 may also include I/O interfaces 410, 412, and/or 414. PS 106 includes a PCIe interface 416. HBCs 112 include a memory controller 418 that connects to off-chip memory 420.

In the example, device images may be loaded into programmable device 100 through any of a variety of different communication paths. For example, device image 422 may be loaded into programmable device 100 via I/O interface 410, 412, or 414. Device image 424 may be loaded into programmable IC 100 via an interface implemented using one or more HBCs 112. For example, device image 424 may be loaded into programmable device 100 through an Ethernet port. Device image 426 may be stored in off-chip memory 420 and loaded into programmable device 100 through memory controller 418. In another example, device image 426 may be provided from a host computing system to programmable device 100 through PCIe interface 416.

In one aspect, since PMC 110 controls loading and/or unloading of device images, PMC 110, e.g., processor 402 (or processor(s) 304 and/or 306 referring to FIG. 3) can record in PATD register 320 the particular communication path (e.g., I/O interface) through which a device image is loaded into programmable device 100. In one aspect, a code specifying the particular I/O interface may be stored in association with any other trace data corresponding to the particular device image that was loaded.

Figure 5:
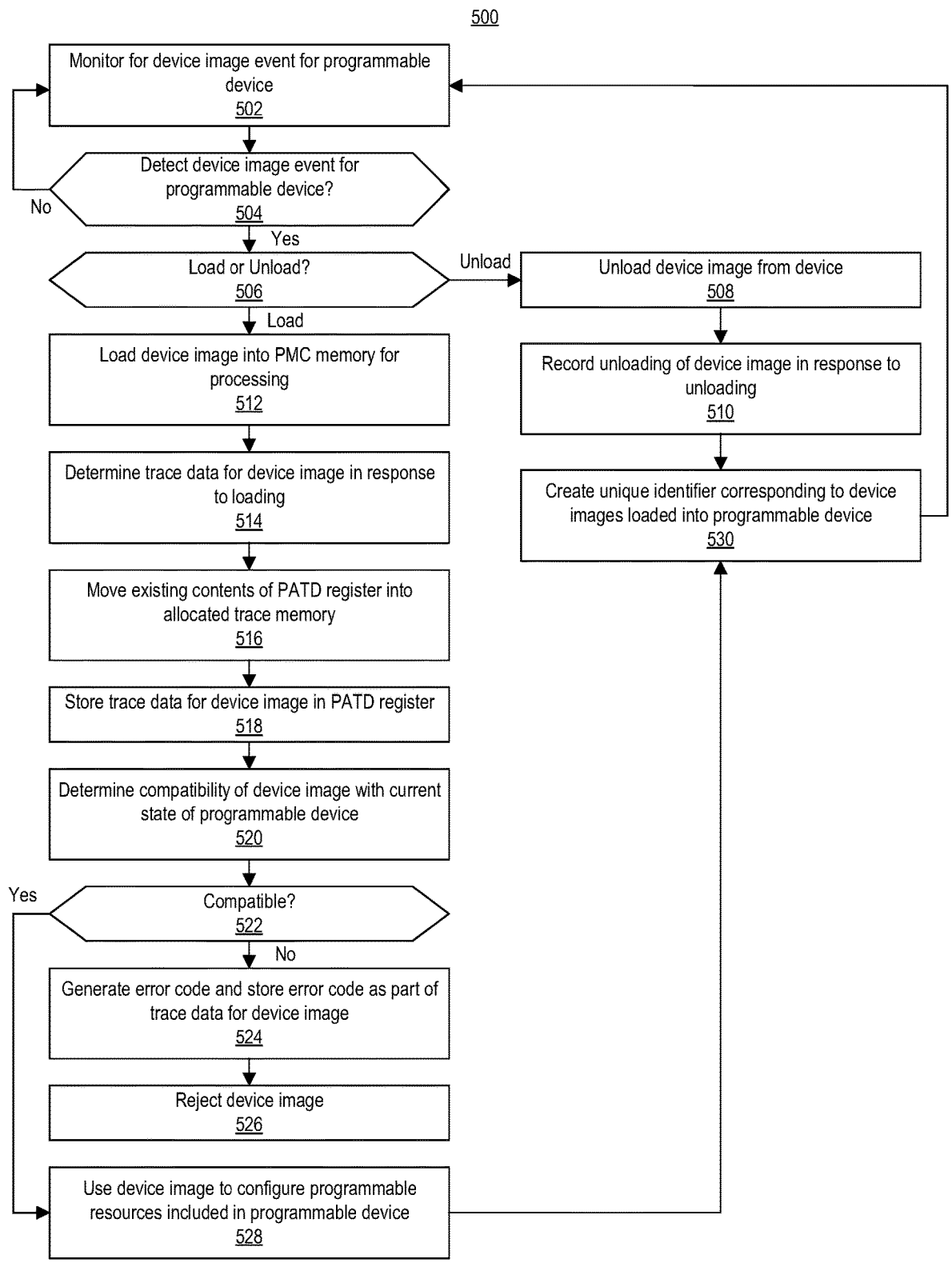
FIG. 5 illustrates an example method of operation for the PMC described in connection with FIG. 1.

FIG. 5 illustrates an example method 500 of operation for PMC 110. Method 500 may be performed by a processor within PMC 110 (e.g., the PMC processing unit 302 and, more particularly, by one or both of processors 304, 306 or processor 402). For purposes of discussion, the processor of PMC 110 that implements the operations of FIG. 5 is referred to as "the processing unit."

Further, while FIG. 5 is generally described in the context of partial reconfiguration of programmable device 100, it should be appreciated that method 500 may be performed in cases where programmable device 100 is fully reconfigured. In addition, method 500 may be performed in other types of programmable devices that include programmable logic and that have a separate entity that is tasked with loading and/or unloading device images (e.g., configuration data).

In block 502, the processing unit monitors for a device image event for the programmable device. In one aspect, the processing unit is capable of monitoring for the occurrence of an interrupt indicating that a device image is to be loaded. For example, the availability of a device image at a slave interface of the programmable device such as the JTAG port may cause an interrupt to be generated and provided to the processing unit. In another aspect, the processing unit may monitor for the receipt of a request, e.g., a signal, for a device image to be loaded. The request may originate from another circuit within the programmable device or from another circuit external to the programmable device (e.g., a host system).

In block 504, the processing unit determines whether a device image event for the programmable device has been detected. In response to detecting a device image event for the programmable device, method 500 continues to block 506. In response to detecting no device image event for the programmable device, method 500 loops back to block 502 and may continue to monitor for a device image event.

In block 506, the processing unit determines whether the detected device image event is a load event requesting the loading of a particular device image or an unload event requesting a particular device image already loaded in the programmable device be unloaded. In response to determining that the detected device image event is a load event, method 500 continues to block 512. In response to determining that the detected device image event is an unload event, method 500 continues to block 508.

Continuing with block 512, the processing unit loads the device image into memory within the PMC for processing. For example, the processing unit is capable of loading the device image, referred to as the "current device image," from an external source and storing the device image within the PMC shared memory for further processing. In another aspect, prior to obtaining any trace data from the current device image, the processing unit may have to decrypt the current device image, authenticate the current device image, and/or validate the current device image. The processing unit is capable of providing the current device image to one or more of the security accelerators, e.g., encryption/decryption block 346, authentication block 348, and/or hash block 350 to ensure that the current device image is safe to use to program programmable circuit resources of the programmable device.

In block 514, the processing unit determines trace data for the current device image in response to the loading operation performed in block 512. In one aspect, the processing unit is capable of determining one or more or all items of information listed in Table 1. For example, the current device image may specify a reconfigurable module. In that case, the processing unit is capable of extracting the static partition ID, the reconfigurable partition ID, and the reconfigurable module ID from the current device image. The device image may also specify a device ID indicating the particular type or model of programmable device with which the device image is intended to be used.

In one aspect, the processing unit is capable of determining the coordinates in the PL that are used by the device image (e.g., the Area Region of Table 1). The current device image may include configuration data for the PL. The processing unit is capable of determining those sections, or coordinates, of the PL that are configured by the configuration data in the current device image.

As discussed, some information specified in Table 1 is extracted from the current device image. Other information specified in Table 1 may not be obtained from the device image. For example, the processing unit is capable of determining trace data for the current device image that indicates or specifies the source from which the current device image was obtained. For example, the processing unit is capable of determining a master ID. The master ID specifies the physical port of NoC 108 through which the access came.

In another example, the processing unit is capable of determining a programming access ID (e.g., with reference to Table 1). The programming access ID indicates the entity (e.g., agent and/or master) that requested partial reconfiguration. For example, in a data center, a host system (e.g., a server) may request that a device image be loaded into the programmable device. In that case, the processing unit captures the programming access ID of the server from the request (e.g., where the request is an example of a device image event). In another example, the application (e.g., circuitry) implemented in the programmable device may request the loading of a device image. In that case, the processing unit captures the programming access ID of the requesting circuit. The programming access ID specifies the particular agent making the request. In illustration, if two agents are connected to the same port of NoC 108, requests from both agents would have the same master ID. Each request, however, would have a different programming access ID.

In another example, the processing unit may determine the communication pathway and/or source from which the device image is obtained. As an illustrative and non-limiting example, the processing unit may store an identifier, as part of the trace data, indicating the particular I/O interface through which the current device image was loaded. Examples of I/O interfaces through which a device image may be loaded include, but are not limited to, SelectMAP, PCIe, DDR (e.g., off-chip) memory, Flash (QSPI/OSPI) (e.g., corresponding to I/O interfaces 320), JTAG, and/or any other I/O interface that is connected to PMC 110 via NoC 108 such as CAN, Ethernet, USB, PS, or the like.

The processing unit is also capable of generating one or more items of trace data corresponding to the device image(s) that have been loaded into the programmable device. In one aspect, as each device image is loaded, the processing unit increments a count (e.g., Access Event Count in Table 1) specifying a number of device images that have been loaded into the programmable device since the last reset of the programmable device. The count may be contained in a portion of the PATD register that is incremented each time the register is written. The processing unit clears the count in response to a reset of the programmable device (e.g., either a hard reset where power is cycled off and back on) or a soft reset.

In one aspect, unloading a device image is implemented by loading a device image that is designated as an "unload device image." For example, an unload device image is a device image that clears (e.g., overwrites to blank or delete the prior configuration data) a reconfigurable partition. The processing unit may increment the counter in response to the loading of a device image and in response to the loading of an unload device image. The processing unit may also track the loading of an unload device image in order to determine which reconfigurable partitions are available (cleared or unloaded) at any given time.

In block 516, the processing unit moves the existing contents of the PATD register (corresponding to a prior processed device image) into allocated trace memory for longer term storage. In one aspect, memory within the programmable device is allocated for use as trace data storage. The memory may be within PMC shared RAM 316 or may be one or more BRAMs and/or URAMs located in PL 104. In another aspect, the memory may be external to the programmable device. For example, the memory allocated for trace data storage may be within an external RAM (e.g., off-chip memory 420) to which the processing unit may read and/or write.

In block 518, the processing unit stores the trace data determined in block 514 for the current device image in the PATD register. Since the prior trace data has been stored in a different memory allocated for trace data, the processing unit may overwrite the contents of the PATD register with the trace data for the current device image. As noted, the Access Event Count may be incremented.

In block 520, the processing unit determines compatibility of the device image with the current state of the programmable device. In one aspect, as part of block 520 or prior to block 520, the processing unit is capable of performing a device ID check. For example, the processing unit is capable of comparing the device ID of the device image with the device ID of the programmable device to ensure the two match. This operation prevents programming of the programmable device with a device image intended for use with a different programmable device.

In one aspect, the current state of the programmable device includes the particular platform that is implemented therein. The current device image may specify a reconfigurable module that is to be used as part of a partial reconfiguration process for the programmable device. In that case, the current device image includes reconfigurable partition ID, a reconfigurable module ID, and a static partition ID. Accordingly, in one aspect, determining compatibility of the current device image with the current state of the programmable device includes determining compatibility of the current device image with the platform that is already implemented in the programmable device. The processing unit, for example, in response to loading a device image specifying a platform, may store trace data for the platform (e.g., in the PATD register and move that data to the allocated trace data memory). The trace data for the platform may include a static partition ID. The trace data for the platform may be stored with an identifier that distinguishes the trace data for the platform from trace data for other device images that do not specify platforms.

Accordingly, the processing unit is capable of comparing one or more items of the trace data for the current device image with stored trace data for the platform. In one aspect, the processing unit is capable of comparing the static image ID of the platform with the static image ID read from the current device image. The processing unit determines whether the two static image IDs match. The processing unit determines whether the device image is compatible with the platform based on the comparison of the two static image IDs and whether the two static image IDs match.

In another aspect, the processing unit may perform additional checks. For example, the processing unit may check that the device image has the correct header by performing authentication. In some cases, the processing unit may need to initially decrypt the device image and/or header. In another aspect, the processing unit may perform a hash operation on the header(s) and/or NPI data included in the device image. Any detected errors from such operations may also be stored in the PATD register.

In block 522, in response to determining that the current device image is compatible with the platform, e.g., in the case where the two static image IDs match, method 500 continues to block 528. In response to determining that the current device image is not compatible with the platform, e.g., in the case where the two static image IDs do not match, method 500 continues to block 524.

In block 524, the processing unit generates an error code indicating the incompatibility of the current device image with the platform. The processing unit stores the error code as part of the trace data for the device image in the PATD register. In block 526, the processing unit rejects the device image. For example, the processing unit does not use the current device image to program any programmable circuit resources of the programmable device. The processing unit further may delete the current device image from the PMC shared memory. Though deleted, the processing unit maintains the trace data within the PATD and offloads the trace data to the allocated memory as described. Particular items of the data indicate that the device image was not used to program programmable resources of the programmable device.

In block 528, in the case where the device image is compatible with the current state of the SoC, the processing unit uses the device image to configure the programmable circuit resources included in the programmable device. After block 528, method 500 may continue to block 530.

In another aspect, as part of loading the device image, the processing unit is capable of receiving any error codes that may be generated by other circuit blocks within the programmable device and logging such error codes as part of the trace data. For example, if the CRC circuitry of CFI 114 generates an error, the processing unit is capable of logging the error code by setting the CFI CRC Error bit in the trace data shown in Table 1. The processing unit is capable of checking any data loaded into NPI 134 using hash block 350. In response to detecting an error in the programming of NPI 134 based on hash block 350, the processing unit is capable of logging the error code by setting the NPI Error bit in the trace data shown in Table 1. The logging of errors as described herein provides information in cases where a device image is rejected as well as when the device image is accepted, but where errors occur while using the device image to program the programmable circuit resources of the programmable device.

In block 508, the processing unit unloads the device image specified in the device image event from the programmable device. For example, the processing unit is capable of clearing the configuration memory cells of the programmable device that were storing configuration data of the device image that is to be unloaded. As noted, in one aspect, the processing unit receives, as the device image event, an unload device image that is used to overwrite, e.g., clear, a particular reconfigurable partition.

In block 510, in response to the unloading, the processing unit records the unloading of the device image in the trace data in memory. For example, the processing unit updates trace data for the device image that is unloaded in response to the unloading operation. In one aspect, the processing unit updates the trace data in the PATD register if the PATD register still stores the trace data for the device image unloaded in block 508. For example, the processing unit may update the trace data with the time that the device image is unloaded (e.g., Unload Time of Table 1) and increment the Access Event Count.

In another aspect, where the trace data for the device image unloaded in block 508 is stored in a different memory, the processing unit may initiate a write operation to update the trace data in such memory. As noted, for example, the processing unit may update the trace data in that memory to store the time that the device image was unloaded and increment the Access Event Count. In one aspect, the processing unit is capable of determining the time by reading the RTC included in the PMC and writing the time to the PATD or the memory storing the trace data.

In block 530, the processing unit is capable of creating a unique identifier corresponding to the device image(s) loaded into the programmable device. For example, the processing unit is capable of determining the identifier for each device image that is active within the programmable device. A device image that is active in the programmable device is one that is currently in use to program one or more programmable circuit resources in the programmable device. The processing unit is capable of generating a unique hash of the identifiers of each active device image. For purposes of block 530, the processing unit may also generate unique identifiers for unload device images. The resulting unique identifier may be stored within the PATD register and/or as part of the trace data. After block 530, method 500 may loop back to block 502 to continue processing.

For example, the unique identifier generated in block 530 may be a hash of all the active (e.g., successful programming) IDs of device images that have been used. The unique identifier may be used to quickly determine if the state of the programmable device has changed by comparing the unique identifier to a prior generated unique identifier. In illustration, consider the case where, through JTAG, an entity is capable of determining whether the programmable device has been reprogrammed and/or reconfigured wholly or partially simply by polling the register that stores the unique identifier. The first time the register is polled, the unique identifier read from the register may be compared to any other values read from the register in the future. In response to detecting a difference or a change in the value from one polling of the register to another, an entity may continue to looking at the trace data in greater detail to determine the changes that have been made. This technique reduces the bandwidth needed for an entity to detect differences in the programmable device. The entity need only query the trace data in greater detail in response to detecting a change.

The trace data that is collected by the PMC may be read out at any time for purposes of debugging, error analysis, or the like. An external system, e.g., a computer system, may read the trace data from the memory at any point during operation of the programmable device. Because the trace data is generated by the programmable device itself using the PMC, which operates as the Root-of-Trust of the device, the trace data provides a complete and accurate picture of the state of the programmable device at each point in time covered by the trace data.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without user intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," "one or more embodiments," "particular embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," "in particular embodiments," and similar language throughout this disclosure may, but do not necessarily, all refer to the same embodiment. The terms "embodiment" and "arrangement" are used interchangeably within this disclosure.

As defined herein, the term "processor" means at least one hardware circuit. The hardware circuit may be configured to carry out instructions contained in program code.

As defined herein, the term "output" means storing in physical memory elements, e.g., devices, writing to display or other peripheral output device, sending or transmitting to another system, exporting, or the like.

As defined herein, the term "real time" means a level of processing responsiveness that a user or system senses as sufficiently immediate for a particular process or determination to be made, or that enables the processor to keep up with some external process.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions (e.g., firmware) thereon for causing a processor to carry out aspects of the inventive arrangements described herein. Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor to produce a machine, such that the instructions, which execute via the processor, create means for implementing the functions/acts specified in the flowchart and/or block diagram block or blocks. These computer readable program instructions may also be stored in a computer readable storage medium that can direct a processor to function in a particular manner, such that the computer readable storage medium having instructions stored therein comprises an article of manufacture including instructions which implement aspects of the operations specified in the flowchart and/or block diagram block or blocks.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

A method can include, in response to loading a device image for a programmable device, determining, using a processing unit on the programmable device, trace data for the device image, storing, by the processing unit, the trace data for the device image in a memory, and, in response to unloading the device image, recording the unloading of the device image in the trace data in the memory.

In another aspect, the memory is on the programmable device.

In another aspect, the memory is external to the programmable device.

In another aspect, a plurality of device images are loaded into the programmable device concurrently. The method can include creating a unique identifier corresponding to the device images loaded into the programmable device and storing the unique identifier within the memory.

In another aspect, the method can include counting, by the processing unit, a number of device images loaded into the programmable device since a reset of the programmable device.

In another aspect, the device image specifies a reconfigurable module loaded as part of partial reconfiguration of the programmable device. The device image includes a reconfigurable partition identifier and a reconfigurable module identifier. The method can include storing the reconfigurable partition identifier and the reconfigurable module identifier as part of the trace data.

In another aspect, platform circuitry is already implemented in the programmable device using programmable circuit resources of the programmable device. In that case, the method can include detecting compatibility of the device image with the platform circuitry based on a comparison of trace data for the device image with trace data for the platform circuitry.

In another aspect, the method can include, in response to determining an incompatibility from the detecting, generating an error code and storing the error code as part of the trace data.

In another aspect, the method can include, in response to determining an incompatibility from the detecting, rejecting the device image.

In another aspect, the method can include determining an identifier of a master requesting loading of the device image and storing the identifier as part of the trace data for the device image.

A device can include a plurality of programmable circuit resources and a processor configured to program the programmable circuit resources. The processor can initiate executable operations including, in response to loading a device image for the device, determining trace data for the device image, wherein the device image includes programming data for one or more of the plurality of programmable circuit resources, storing the trace data for the device image in a memory, and, in response to unloading the device image, recording the unloading of the device image in the trace data in the memory.

In another aspect, the memory is on the device.

In another aspect, the memory is external to the device.

In another aspect, a plurality of device images are loaded into the device concurrently. The processor may be configured to initiate operations further including creating a unique identifier corresponding to the plurality of device images loaded into the device and storing the unique identifier within the memory.

In another aspect, the processor is configured to initiate operations further including counting a number of device images loaded into the device since a reset of the device.

In another aspect, the device image specifies a reconfigurable module loaded as part of partial reconfiguration of the device. The device image can include a reconfigurable partition identifier and a reconfigurable module identifier. The processor may be configured to initiate operations further including storing the reconfigurable partition identifier and the reconfigurable module identifier as part of the trace data.

In another aspect, platform circuitry is already implemented in the device using selected ones of the plurality of programmable circuit resources. The processor may be configured to initiate operations further including detecting compatibility of the device image with the platform circuitry based on a comparison of trace data for the device image with trace data for the platform circuitry.

In another aspect, the processor is configured to initiate operations further including, in response to determining an incompatibility from the detecting, generating an error code and storing the error code as part of the trace data.

In another aspect, the processor is configured to initiate operations further including, in response to determining an incompatibility from the detecting, rejecting the device image.

In another aspect, the processor is configured to initiate operations further including determining an identifier of a master requesting loading of the device image and storing the identifier as part of the trace data for the device image.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method, comprising:
   in response to loading a device image for a programmable device, determining, using a processing unit on the programmable device, trace data for the device image;
   wherein the device image specifies a reconfigurable module loaded as part of partial reconfiguration of the programmable device, wherein the device image includes a reconfigurable partition identifier and a reconfigurable module identifier;
   storing, by the processing unit, the trace data for the device image in a memory, wherein the reconfigurable partition identifier and the reconfigurable module identifier are stored as part of the trace data; and
   in response to unloading the device image, recording the unloading of the device image in the trace data in the memory.

2. The method of claim 1, wherein the memory is on the programmable device.

3. The method of claim 1, wherein the memory is external to the programmable device.

4. The method of claim 1, wherein a plurality of device images are loaded into the programmable device concurrently, the method comprising:
creating a unique identifier corresponding to each of the plurality of device images loaded into the programmable device; and
storing the unique identifiers within the memory.

5. The method of claim 1, further comprising:
counting, by the processing unit, a number of device images loaded into the programmable device since a reset of the programmable device.

6. The method of claim 1, wherein platform circuitry is already implemented in the programmable device using programmable circuit resources of the programmable device, the method further comprising:
detecting compatibility of the device image with the platform circuitry based on a comparison of the trace data for the device image with trace data for the platform circuitry.

7. The method of claim 6, further comprising:
in response to determining an incompatibility from the detecting, generating an error code and storing the error code as part of the trace data.

8. The method of claim 6, further comprising:
in response to determining an incompatibility from the detecting, rejecting the device image.

9. The method of claim 1, further comprising:
determining an identifier of a master requesting loading of the device image and storing the identifier as part of the trace data for the device image.

10. A device, comprising:
a plurality of programmable circuit resources; and
a processor configured to program the plurality of programmable circuit resources, wherein the processor initiates executable operations including:
in response to loading a device image for the device, determining trace data for the device image, wherein the device image includes programming data for one or more of the plurality of programmable circuit resources;
wherein the device image specifies a reconfigurable module loaded as part of partial reconfiguration of the device, wherein the device image includes a reconfigurable partition identifier and a reconfigurable module identifier;
storing the trace data for the device image in a memory, wherein the reconfigurable partition identifier and the reconfigurable module identifier are stored as part of the trace data; and
in response to unloading the device image, recording the unloading of the device image in the trace data in the memory.

11. The device of claim 10, wherein the memory is on the device.

12. The device of claim 10, wherein the memory is external to the device.

13. The device of claim 10, wherein a plurality of device images are loaded into the device concurrently, wherein the processor is configured to initiate operations further comprising:
creating a unique identifier corresponding to each of the plurality of device images loaded into the device; and
storing the unique identifiers within the memory.

14. The device of claim 10, wherein the processor is configured to initiate operations further comprising:
counting a number of device images loaded into the device since a reset of the device.

15. The device of claim 10, wherein platform circuitry is already implemented in the device using selected ones of the plurality of programmable circuit resources, wherein the processor is configured to initiate operations further comprising:
detecting compatibility of the device image with the platform circuitry based on a comparison of the trace data for the device image with trace data for the platform circuitry.

16. The device of claim 15, wherein the processor is configured to initiate operations further comprising:
in response to determining an incompatibility from the detecting, generating an error code and storing the error code as part of the trace data.

17. The device of claim 15, wherein the processor is configured to initiate operations further comprising:
in response to determining an incompatibility from the detecting, rejecting the device image.

18. The device of claim 10, wherein the processor is configured to initiate operations further comprising:
determining an identifier of a master requesting loading of the device image and storing the identifier as part of the trace data for the device image.

\* \* \* \* \*